United States Patent
Holden et al.

(10) Patent No.: US 9,443,714 B2
(45) Date of Patent: Sep. 13, 2016

(54) METHODS AND APPARATUS FOR SUBSTRATE EDGE CLEANING

(71) Applicant: APPLIED MATERIALS, INC., Santa Clara, CA (US)

(72) Inventors: James Matthew Holden, San Jose, CA (US); Song-Moon Suh, San Jose, CA (US); Todd Egan, Fremont, CA (US); Kalyanjit Ghosh, San Jose, CA (US); Leon Volfovski, Pacifica, CA (US); Michael R. Rice, Pleasanton, CA (US); Richard Giljum, Brentwood, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 220 days.

(21) Appl. No.: 13/785,903

(22) Filed: Mar. 5, 2013

(65) Prior Publication Data

US 2014/0251375 A1 Sep. 11, 2014

(51) Int. Cl.
*H01L 21/02* (2006.01)
*H01L 21/67* (2006.01)

(52) U.S. Cl.
CPC ... *H01L 21/02076* (2013.01); *H01L 21/02087* (2013.01); *H01L 21/67051* (2013.01)

(58) Field of Classification Search
CPC .................................................. H01L 21/02076
See application file for complete search history.

(56) References Cited

U.S. PATENT DOCUMENTS

| | | | |
|---|---|---|---|
| 5,927,303 A * | 7/1999 | Miya et al. | 134/148 |
| 6,066,032 A | 5/2000 | Borden et al. | |
| 6,684,523 B2 | 2/2004 | Bailey et al. | |
| 6,725,564 B2 | 4/2004 | Hunter et al. | |
| 6,779,226 B2 | 8/2004 | Hunter et al. | |
| 2007/0022948 A1* | 2/2007 | Rose et al. | 118/52 |
| 2007/0128869 A1 | 6/2007 | Chen | |
| 2008/0280453 A1 | 11/2008 | Koelmel et al. | |
| 2009/0038641 A1 | 2/2009 | Matsumoto | |
| 2011/0155177 A1 | 6/2011 | Tamura et al. | |

FOREIGN PATENT DOCUMENTS

KR  20-2011-0008387 U  8/2011

OTHER PUBLICATIONS

Pandit et al., "Using Ionizers to Reduce Electrostatically Adhered Particles on Wafer Backside", IEEE Transactions on Semiconductor Manufacturing, vol. 24, No. 2, May 2011. pp. 158-164.
U.S. Appl. No. 13/785,834, filed Mar. 5, 2013, Holden et al.
International Search Report and Written Opinion mailed Jun. 24, 2014 for PCT Application No. PCT/US2014/018182.

* cited by examiner

*Primary Examiner* — Jason Ko
(74) *Attorney, Agent, or Firm* — Moser Taboada; Alan Taboada

(57) ABSTRACT

A substrate cleaning apparatus may include a substrate support having a support surface to support a substrate to be cleaned, wherein the substrate support is rotatable about a central axis normal to the support surface; a first nozzle to provide a first cleaning gas to a region of the inner volume corresponding to the position of an edge of the substrate when the substrate is supported by the support surface of the substrate support; a first annular body disposed opposite and spaced apart from the support surface of the substrate support by a gap, the first annular body having a central opening defined by an inner wall shaped to provide a reducing size of the gap between the first annular body and the support surface in a radially outward direction; and a first gas inlet to provide a first gas to the central opening of the first annular body.

18 Claims, 6 Drawing Sheets

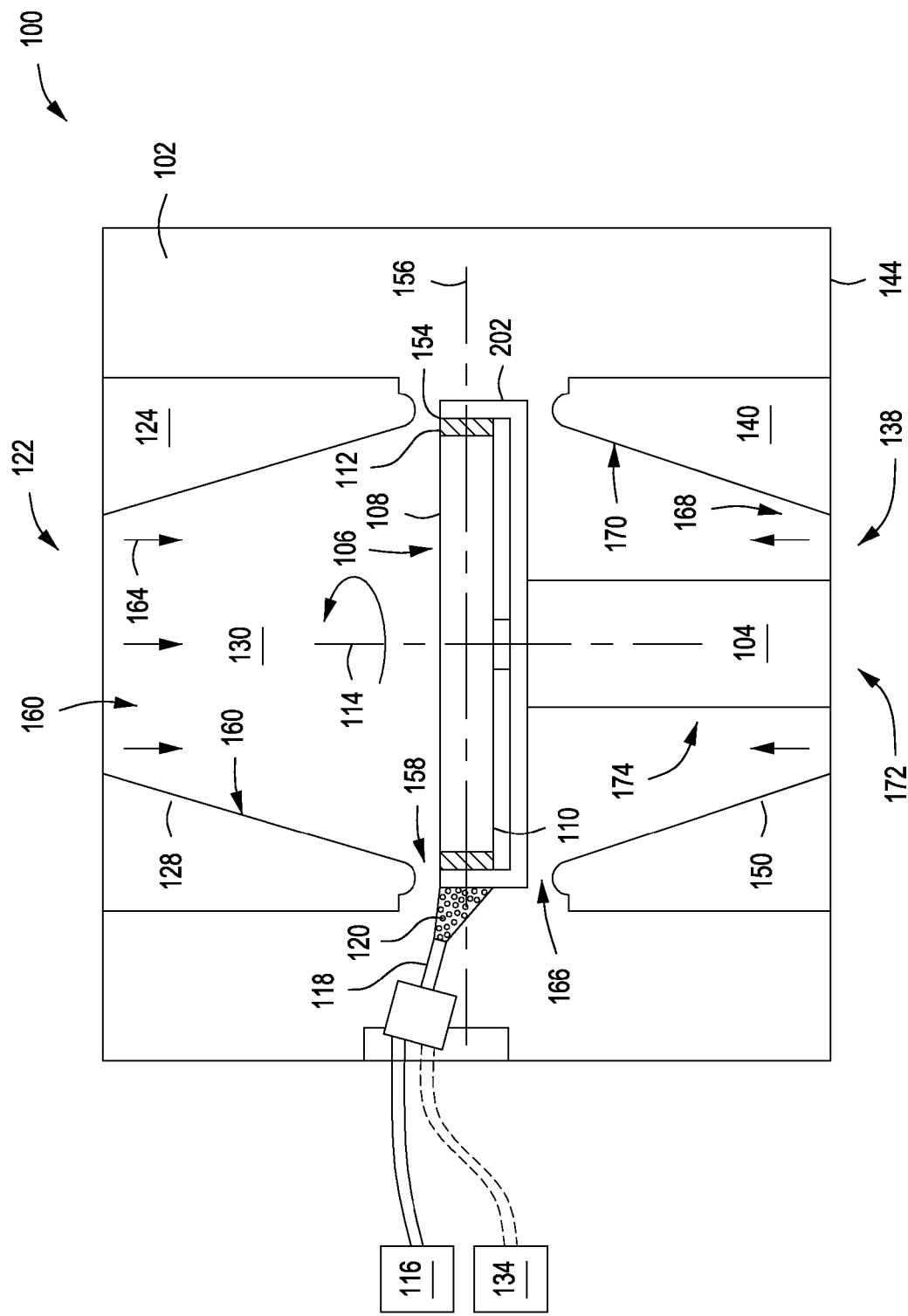

METHODS AND APPARATUS FOR SUBSTRATE EDGE CLEANING

FIELD

Embodiments of the present invention generally relate to semiconductor processing equipment.

BACKGROUND

A semiconductor substrate is handled on its edge and backside numerous times during the manufacturing process, for example during metal deposition, chemical vapor deposition, or etching processes. Such handling can cause contaminants to adhere to the edge of the substrate and to the backside of the substrate and travel from chamber to chamber, substrate to substrate, FOUP to FOUP, or process tool to process tool along with the substrate. These contaminants can migrate to the front side of the substrate, resulting in yield loss. Typical solutions to this problem have been to remove the contaminants through an in-production-line cleaning tool using wet chemicals, backside scrubbing, attempts to limit particle formation, and/or frequent cleaning of process tools. However, these steps only mitigate the yield loss and are costly in terms of equipment and consumables.

As such, the inventors have provided improved methods and apparatus for cleaning particle contamination from a substrate edge.

SUMMARY

Embodiments of an apparatus for cleaning contaminants from a substrate are disclosed herein. In some embodiments, a substrate cleaning apparatus may include a substrate support having a support surface to support a substrate to be cleaned, wherein the substrate support is rotatable about a central axis normal to the support surface; a first nozzle to provide a first cleaning gas to a region of the inner volume corresponding to the position of an edge of the substrate when the substrate is supported by the support surface of the substrate support; a first annular body disposed opposite and spaced apart from the support surface of the substrate support by a gap, the first annular body having a central opening defined by an inner wall of the first annular body extending from a first side of the first annular body remote from the support surface to a second side of the first annular body proximate to the support surface, wherein the central opening proximate to the support surface is sized to expose a predominant portion of the support surface, and wherein the inner wall is shaped to provide a reducing size of the gap between the first annular body and the support surface in a radially outward direction; and a first gas inlet to provide a first gas to the central opening of the first annular body.

In some embodiments, a method of cleaning contaminants from a substrate is provided. In some embodiments a method of cleaning contaminants from a substrate may include (a) supporting a substrate atop a substrate support disposed within an inner volume of a process chamber; (b) rotating the substrate about a central axis normal to the first side of the substrate; (c) directing a first cleaning gas of solid and gaseous carbon dioxide from a liquid carbon dioxide source to a region of the inner volume corresponding to the position of an edge of the substrate when the substrate is supported by the substrate support; and (d) flowing a first gas over the first side of the substrate such that a velocity of the first gas as it flows past the edge of the substrate increases as compared to the velocity of the first gas as it flows over the first side proximate a center of the substrate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIGS. 2A-2B respectively depict schematic side and top views of a substrate cleaning apparatus in accordance with some embodiments of the present invention.

Figure 1A:
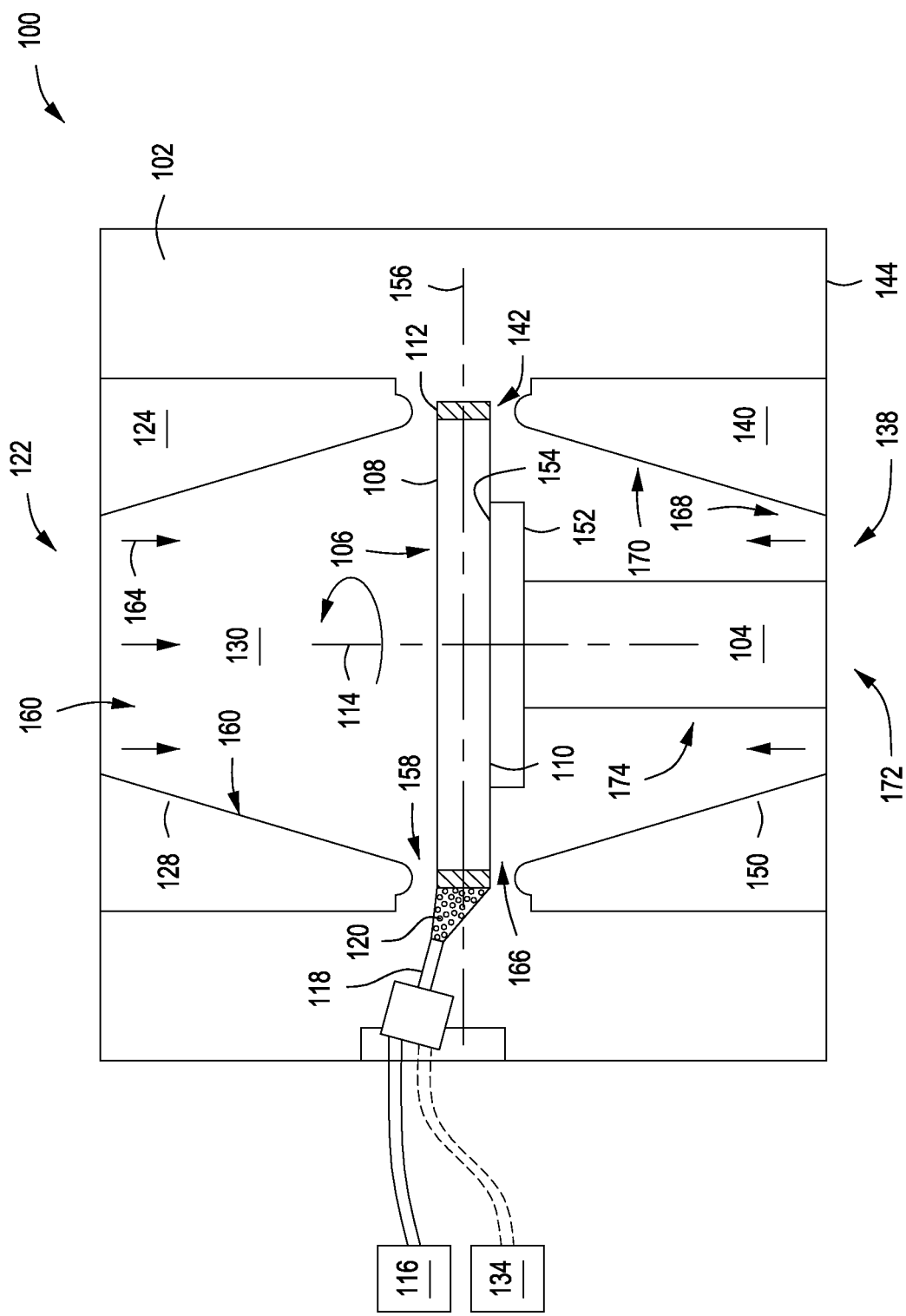
FIGS. 1A-1B respectively depict schematic side and top views of a substrate cleaning apparatus in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the invention provide improved methods and apparatus for cleaning a substrate edge. Embodiments of the present invention may advantageously allow for the removal of contamination accumulated on a substrate edge during the manufacturing process, such as while handling the substrate between process steps and while chucking the substrate inside a process chamber, which can limit or prevent contaminants from reaching the front-side of a substrate and causing yield loss. Embodiments of the present invention may advantageously allow for the removal of the contamination without the potential damage to the substrate associated with contact cleaning or wet cleaning. Embodiments of the present invention may be used on a wide variety of cleaning surfaces where very high particle removal plus very low addition of particles are required, for example, in display processing, silicon chip packaging, hard disk media cleaning, and optics manufacturing. Embodiments of the invention also advantageously prevent contaminants removed from the substrate edge and the substrate backside from reaching the front of the substrate.

FIGS. 1A-1B and FIGS. 2A-2B depict schematic views of a substrate cleaning apparatus in accordance with some embodiments of the present invention. The substrate cleaning apparatus generally includes a substrate support 104 having a support surface 154 to support a substrate 106. In some embodiments, the substrate support 104 is disposed within a process chamber 100 having an inner volume 102.

In some embodiments, the substrate support 104 is coupled to a bottom wall 144 of the process chamber 100. Although discussed herein primarily as being enclosed in a process chamber, in some embodiments, as described below with respect to FIG. 5, the substrate cleaning apparatus may be disposed in any of a number of locations on a cluster tool including configurations without a process chamber enclosure, to clean substrates as they move past the cleaning apparatus.

The substrate 106 may be any suitable substrate used in a semiconductor or similar thin-film manufacturing processes, such as circular, square, rectangular, or other shaped substrates of various materials. In some embodiments, the substrate 106 may be a semiconductor wafer (e.g., a 200 mm, 300 mm, 450 mm, or the like silicon wafer). The substrate 106 to be cleaned generally includes a first side 108, a second side 110, and an edge 142 containing contaminants 112.

A first nozzle 118 provides a first cleaning gas 120 to a region of the inner volume 102 corresponding to the position of the edge 142 of the substrate 106 when the substrate 106 is supported by the support surface of the substrate support 104. The first cleaning gas 120 comprises a stream of solid carbon dioxide entrained in a stream of gaseous carbon dioxide.

The substrate support 104 is rotatable about a central axis 114 normal to the substrate support 104. The rotatable substrate support 104 advantageously presents the contaminated edge 142 of the substrate 106 to the first nozzle 118. As the substrate 106 rotates the first nozzle 118 remains stationary and faces the edge 142 of the substrate 106 at an angle of about −175 degrees to about 175 degrees from a plane 156 extending horizontally outward from a center of the substrate 106. In some embodiments, the first nozzle 118 is about 0.1 cm to about 10 cm from the edge 142 of the substrate 106.

Application of the first cleaning gas 120 to the contaminants 112 on the edge 142 of the substrate 106 removes the contaminants 112 from the edge 142. Without wishing to be bound by theory, the inventors believe that the solid carbon dioxide particles strike the contaminants 112 on the edge 142 and change from the solid phase to the gas phase, resulting in an expansion which pushes the contaminants 112 off of the edge 142. Other physical, chemical, thermal, processes for the removal of the contaminants 112 are possible.

In some embodiments, the first cleaning gas 120 is supplied to the first nozzle 118 from a liquid carbon dioxide source 116 at a pressure of about 200 to about 1000 psi. In some embodiments, the first nozzle 118 is a throttling nozzle, which causes an isenthalpic expansion of the liquid carbon dioxide, such that when the carbon dioxide exits the first nozzle 118, it expands into a first cleaning gas 120 of solid carbon dioxide and gaseous carbon dioxide. The first cleaning gas 120 comprises a greater amount of solid carbon dioxide than gaseous carbon dioxide. In some embodiments, the first cleaning gas 120 comprises about 10% to about 50% solid carbon dioxide and about 90% to about 50% gaseous carbon dioxide.

In some embodiments, the liquid carbon dioxide passes through a fine mesh filter (e.g., a metal mesh filter) within the first nozzle 118 to advantageously remove gross particulates from the liquid carbon dioxide prior to discharge from the first nozzle 212. In some embodiments, the fine mesh filter has a filter pore size of less than 11 nm.

Figure 1B:
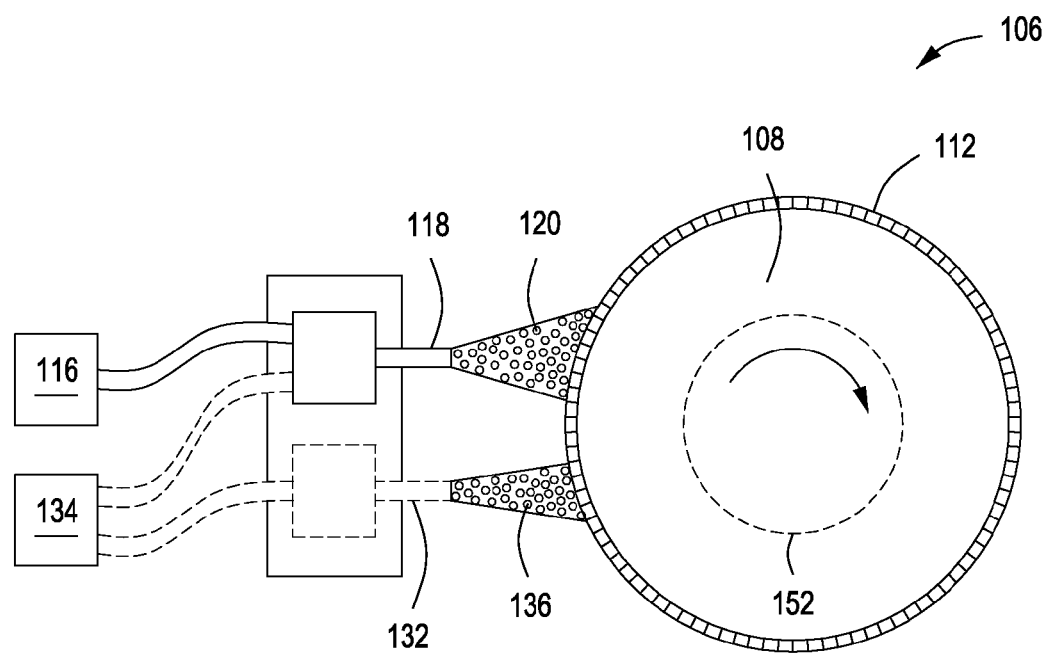
Figure 2B:
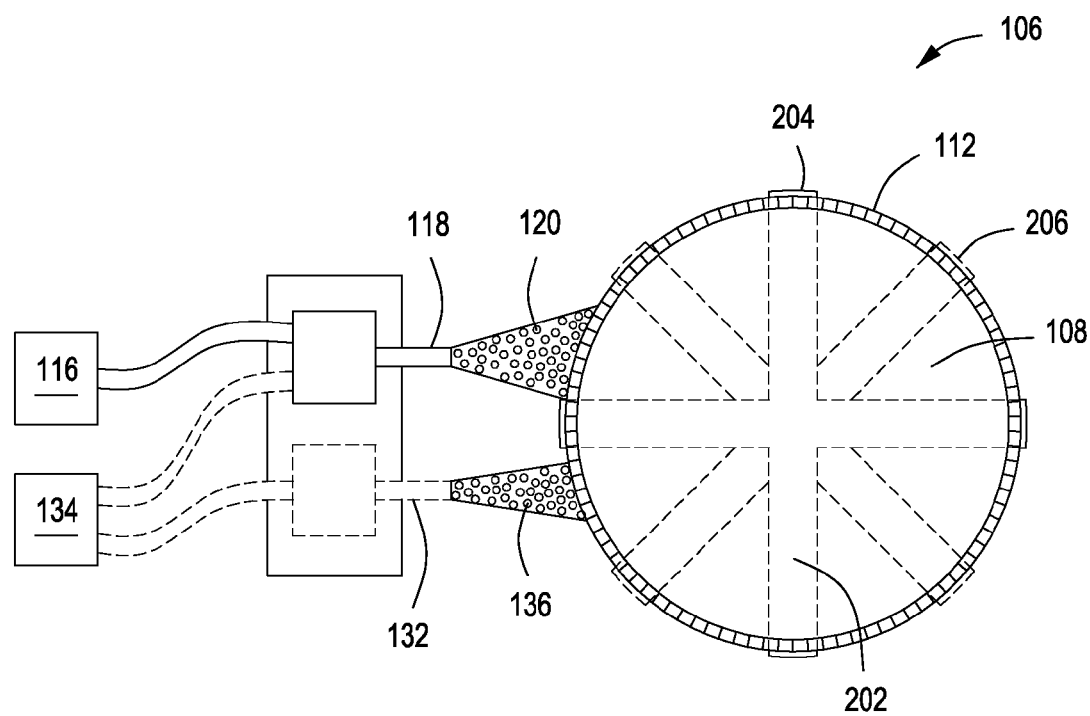

In some embodiments, as depicted in FIGS. 1A-1B, the support surface 154 of the substrate support 104 may include a plate 152 to support the substrate 106 on a second side 110 at the center of the substrate 106. In some embodiments, as depicted in FIGS. 2A-2B, the support surface 154 of the substrate support 104 may include a plurality of arms 202 gripping the edge 142 of the substrate 106 at a plurality of first locations 204. In some embodiments, the substrate can be rotated to allow the plurality of arms 202 to grip the edge 142 of the substrate 106 at a plurality of second locations 206, thereby allowing contaminants 112 at the first locations 204 to be cleaned off the edge 142 of the substrate 106.

The above examples of substrate supports, nozzle configurations, and relative movement therebetween, are illustrative only and other configurations may be utilized to perform the cleaning process as described herein.

In some embodiments, while the first cleaning gas 120 is effective in removing the contaminants 112 from the second side 222 of the substrate 220, it also undesirably deposits a layer of residue onto the edge 112. In some embodiments, the residue comprises metals (e.g., iron, nickel. titanium, aluminum, or alloys thereof), metal oxides (e.g., oxides of the aforementioned metals), organics (e.g., fluorocarbons, hydrocarbons. or other polymer compounds), and other dielectrics (e.g., silicon, silicon oxide, alumina, aluminum nitride, or the like).

In some embodiments, to remove the layer of residue deposited by the first cleaning gas 120, the first nozzle 118 is also coupled to a gaseous carbon dioxide source 134 and discharges a second mixture comprising a stream of solid carbon dioxide entrained in a stream of gaseous carbon dioxide to a region of the inner volume 102 corresponding to the position of the edge 142 of the substrate 106 when the substrate 106 is supported by the support surface of the substrate support 104. In some embodiments, the gaseous carbon dioxide also passes through the fine mesh filter (e.g., nickel mesh filter), as described above, to advantageously remove gross particulates from the gaseous carbon dioxide prior to discharge from the first nozzle 118.

In some embodiments, to remove the layer of residue deposited by the first cleaning gas 120, a second nozzle 132, disposed adjacent to the first nozzle 118, is coupled to a gaseous carbon dioxide source 134 and discharges the second mixture 136 of solid and gaseous carbon dioxide to a region of the inner volume 102 corresponding to the position of the edge 142 of the substrate 106 when the substrate 106 is supported by the support surface of the substrate support 104, 200.

Similar to the first nozzle 118, in some embodiments, the second nozzle 132 is a throttling nozzle which causes an expansion of the gaseous carbon dioxide, such that when the gaseous carbon dioxide exits the second nozzle 132, it expands into a second cleaning gas 136 of solid carbon dioxide and gaseous carbon dioxide. However, the second cleaning gas 136 contains lesser solid carbon dioxide particles in, size as well as in amount, than the first cleaning gas 120. In some embodiments, the second cleaning gas 136 comprises about 1% to about 20% solid carbon dioxide and about 99% to about 80% gaseous carbon dioxide. In some embodiments, the liquid carbon dioxide also passes through a fine mesh filter, as described above, within the second nozzle 132.

In some embodiments, due to the lesser amount of solid carbon dioxide particles, the second cleaning gas 136 is less effective than the first cleaning gas 120 in removing contaminants 112 from the edge 142 of the substrate 106. In addition, the inventors have also observed that although better at removing contaminants 112, a cleaning process that applies only the first cleaning gas 120 undesirably results in a layer of residue from the first cleaning gas 120 adhering to the edge 142 of the substrate 106. However, the inventors have found that a cleaning process using the second cleaning gas 136 is particularly well suited for removing the layer of residue resultant from the cleaning process using the first cleaning gas 120. Thus, the inventors have determined that applying a first cleaning gas 120 from a solid carbon dioxide feed source followed by applying a second cleaning gas 136 from a gaseous carbon dioxide feed source effectively removes contaminants 112 from the edge 142 of the substrate 106 resulting from a substrate manufacturing process and removes any residue deposited by the first cleaning gas 120. In addition, the use of only carbon dioxide as a cleaning agent advantageously reduces the use of expensive and difficult to dispose of cleaning chemicals.

The process chamber 100 further comprises a first annular body 124 disposed opposite and spaced apart from the support surface 154 of the substrate support 106 by a gap 158. The first annular body 124 advantageously creates a physical barrier to contaminant particles that have been removed from the edge 142 of the substrate 106 from reaching the first side 108 of the substrate 106.

The first annular body 124 comprises a central opening 130 defined by an inner wall 128 of the first annular body 124 extending from a first side 160 of the first annular body 124 remote from the support surface 154 to a second side 162 of the first annular body 124 proximate to the support surface 154. The central opening 130 proximate to the support surface 154 is sized to expose a predominant portion of the support surface 154.

A first gas inlet 122 provides a first gas 164 to the central opening 130 of the first annular body 124. In some embodiments, the first gas 164 is air or an inert gas, such as argon or helium. In some embodiments, the air is filtered to remove contaminants. In some embodiments, the air is ionized to neutralize device damaging static charges on the substrate 106.

The inner wall 128 is shaped to provide a reducing size of the gap 158 between the first annular body 124 and the support surface 154 in a radially outward direction. In some embodiments, the gap is between about 2 mm and 10 mm.

Figure 3:
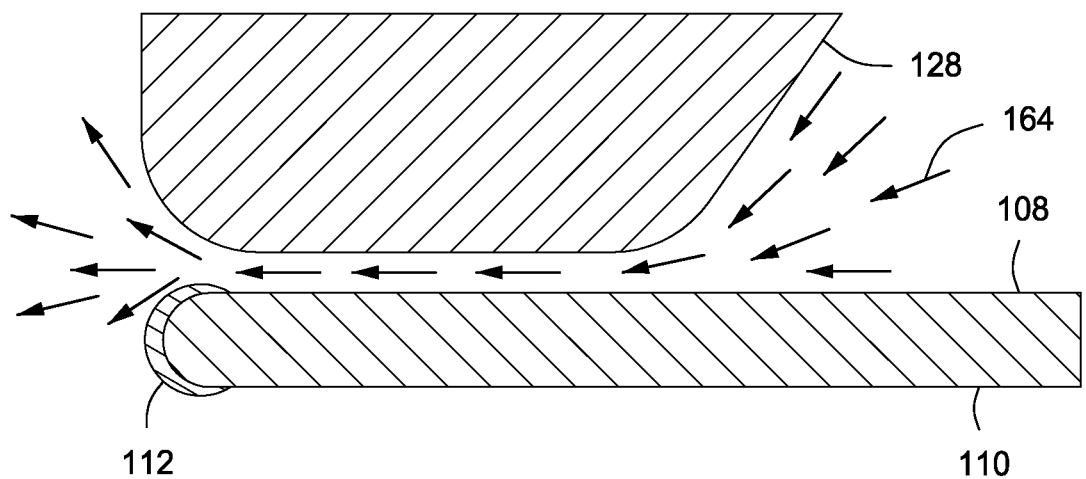
FIG. 3 depicts a schematic view of air flow past an outer edge of the substrate in accordance with some embodiments of the present invention.

As depicted in FIG. 3, the reducing size of the gap 158 forces the first gas 164 through the gap 158 and past the edge 142 of the substrate 106 at a high velocity and reduced pressure. The high velocity of the first gas through the gap 158 and past the edge 142 of the substrate 106 acts as a seal to prevent contaminant particles loosened from the edge 142 of the substrate 106 from traversing the gap 158 and contaminating the first side 108 of the substrate 106.

Returning to FIGS. 1A and 2A, in some embodiments, a second annular body 140 is disposed opposite and spaced apart from the second side 110 of the substrate 106 by a second gap 166. The second annular body 140 advantageously creates a physical barrier to contaminant particles that have been removed from the edge 142 of the substrate 106 from reaching the second side 110 of the substrate 106.

The second annular body 140 comprises a central opening 138 defined by an inner wall 150 of the second annular body 140 extending from a first side 168 of the second annular body 140 remote from the second side 110 of the substrate 106 to a second side 170 of the second annular body 140 proximate to the second side 110 of the substrate 106. The central opening 138 of the second annular body 140 proximate to the second side 110 of the substrate 106 is sized to expose a predominant portion of the second side 110 of the substrate 106.

A second gas inlet 172 provides a second gas 174 to the central opening 138 of the second annular body 140. In some embodiments, the second gas 174 is air or an inert gas, such as argon or helium. In some embodiments, the air is filtered to remove contaminants. In some embodiments, the air is ionized to neutralize device damaging static charges on the substrate 106.

The inner wall 150 of the second annular body 140 is shaped to provide a reducing size of the second gap 166 between the second annular body 140 and the second side 110 of the substrate 106 in a radially outward direction. In some embodiments, the gap is between about 2 mm and 100 mm.

The reducing size of the second gap 166 forces the second gas 174 through the second gap 166 and past the edge 142 of the substrate 106 at a high velocity and reduced pressure. The high velocity of the second gas 174 through the second gap 166 and past the edge 142 of the substrate 106 acts as a seal to prevent contaminant particles loosened from the edge 142 of the substrate 106 from traversing the second gap 166 and contaminating the second side 110 of the substrate 106.

In some embodiments, the process chamber 100 comprises an exhaust system, fluidly coupled to the inner volume 102, to remove loose contaminants from the inner volume 102.

Figure 4:
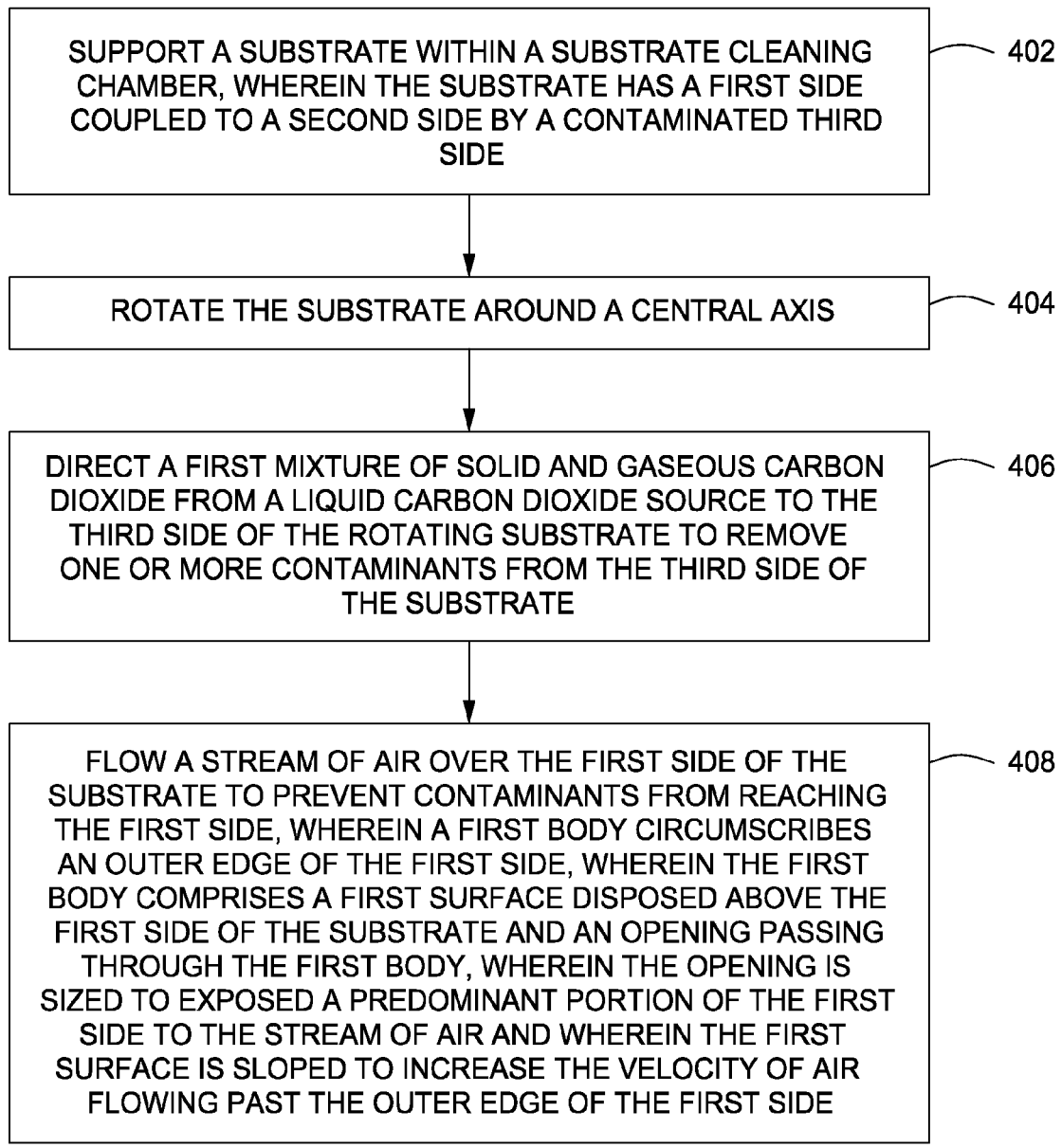
FIG. 4 depicts a flow chart for a method of cleaning a substrate in accordance with some embodiments of the present invention

FIG. 4 depicts one exemplary method 400 of cleaning a substrate 106 using the substrate cleaning apparatus described above. In the method 400, at 402, a substrate 106 that has been processed through a typical substrate manufacturing process, such as chemical vapor deposition or etching, and has a layer of contamination on the edge 142 of the substrate 106 is supported atop a substrate support 106 disposed within an inner volume 102 of a process chamber 100.

At 404, the substrate 106 is rotated about a central axis 114 normal to the first side 108 of the substrate 106. At 406, a first cleaning gas 120 of solid and gaseous carbon dioxide is directed to a region of the inner volume 102 corresponding to the position of an edge 142 of the substrate 106 when the substrate 106 is supported by the substrate support 104.

As discussed above, the rotatable substrate support 104 advantageously presents the contaminated edge 142 of the substrate 106 to the first nozzle 118. In some embodiments, the substrate support 106 may include a plate to support the substrate 106. In some embodiments, the substrate support 200 comprises a plurality of arms 202 gripping the edge 142 of the substrate 106 at a plurality of first locations 204. In some embodiments, the substrate 106 can be rotated such that the plurality of arms 202 grips the edge 142 of the substrate 106 at a plurality of second locations 206 in order to apply the first cleaning gas 120 to contaminants 112 at the plurality of first locations 204 as described in step 404-408.

As discussed above, application of the first cleaning gas 120 to the contaminated edge 142 of the substrate 106 removes contaminants 112 from the edge 142. In some embodiments, application of the first cleaning gas 120 removes between about 10% to about 100% of the contaminants 112.

At 408, a first gas is flowed over the first side 108 of the substrate 106, wherein a first annular body 124, as described above, is disposed opposite and spaced apart from the support surface 154 of the substrate support 106 by a gap 158. The inner wall 128 of the first annular body 124 is shaped to provide a reducing size of the gap 158 between the first annular body 124 and the support surface 154 in a radially outward direction. As a result, the velocity of the first gas 164 as it flows past the edge 142 of the substrate 106 increases as compared to the velocity of the first gas as it flows over the first side proximate a center of the substrate.

In some embodiments, the first cleaning gas 120 leaves a first residue upon the edge 142 of the substrate 106. In some embodiments, a second cleaning gas 136 is directed toward the edge 142 of the substrate 106 to remove at least some of the first residue left by the first cleaning gas 120. In some embodiments, application of the second cleaning gas 136 removes about 50% to about 99% of the residue left by the first cleaning gas 120. As discussed above, the second cleaning gas 136 contains less solid carbon dioxide particles, in size as well as in number, than the first cleaning gas 120. Applying a first cleaning gas 120 from a solid carbon dioxide feed source followed by applying a second cleaning gas 136 from a gaseous carbon dioxide feed source effectively removes contaminants 112 from the edge 142 of the substrate 220 and removes at least some of the residue deposited by the first cleaning gas 120.

Figure 5:
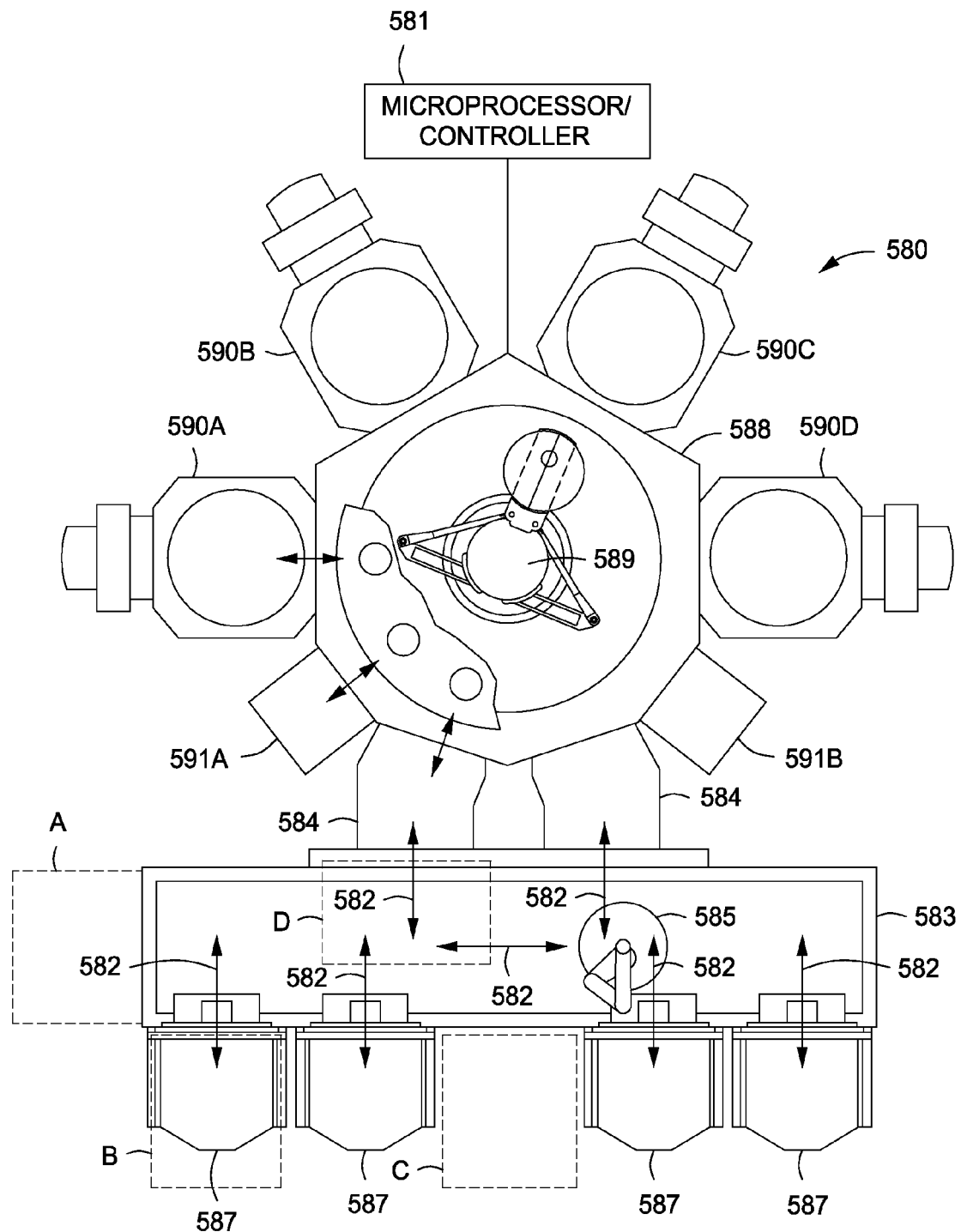
FIG. 5 depicts a cluster tool having a substrate cleaning apparatus in accordance with some embodiments of the present invention.

FIG. 5 depicts a cluster tool suitable for performing portions of the present invention. Generally, the cluster tool is a modular system comprising multiple chambers (e.g., process chambers 590A-D, service chambers 591A-B, or the like) which perform various functions including substrate cleaning, substrate center-finding and orientation, degassing, annealing, deposition and/or etching. According to embodiments of the present invention, the cluster tool may include at least a substrate cleaning apparatus, as described above, configured to perform the method of cleaning a substrate as described above. Integrating the substrate cleaning apparatus with the cluster tool advantageously prevents cross-contamination from chamber to chamber by performing the cleaning process after every manufacturing step. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

By way of illustration, a particular cluster tool 580 is shown in a plan view in FIG. 5. The cluster tool 580 generally comprises a plurality of chambers and robots and is preferably equipped with a microprocessor controller 581 programmed to carry out the various processing methods performed in the cluster tool 580. A front-end environment 583 is shown positioned in selective communication with a pair of load lock chambers 584. A pod loader 585 disposed in the front-end environment 583 is capable of linear and rotational movement (arrows 582) to shuttle cassettes of substrates between the load locks 584 and a plurality of pods 587 which are mounted on the front-end environment 583. The load locks 584 provide a first vacuum interface between the front-end environment 583 and a transfer chamber 588. Two load locks 584 are provided to increase throughput by alternatively communicating with the transfer chamber 588 and the front-end environment 583. Thus, while one load lock 584 communicates with the transfer chamber 588, a second load lock 584 communicates with the front-end environment 583. A robot 589 is centrally disposed in the transfer chamber 588 to transfer substrates from the load locks 584 to one of the various processing chambers 590A-D and service chambers 591A-B.

In some embodiments, the exemplary method 400 of cleaning contaminants from the edge 142 of a substrate 106 as described above may be performed within, at least one of the processing chambers (for example, 590A) configured similar to the exemplary substrate cleaning apparatus described above. Another at least one of the processing chambers (for example, 590B) may be a plasma etch chamber or other process chamber that performs a process on a substrate leading to contaminants being disposed on the edge of the substrate necessitating removal. Accordingly, for example, following an etch or other process, the substrate may be removed from the plasma etch chamber 590B and transported to the substrate cleaning chamber 590A by the robot 589 to remove contamination caused during the etch process. By providing a cleaning chamber coupled to the same cluster tool as the process chambers processing the substrate, the substrate may be cleaned as soon as possible after processing, thereby advantageously minimizing contact of the contaminated substrate with processing equipment and migration of the contamination to other components or substrates as well as potentially damaging the substrate or other substrates.

In some embodiments, the cleaning apparatus may be located in any of a number of locations on the cluster tool 580. For example, the cleaning apparatus may be disposed on a side of the factory interface, or front-end environment 583, as depicted by dashed box A. Alternatively or in combination a cleaning apparatus may be coupled to or disposed in place of one of the pods 587 coupled to the front-end environment 583, as depicted by dashed box B. Alternatively or in combination a cleaning apparatus may be coupled to or disposed at a central portion of the front-end environment 583, opposite the load locks 584, as depicted by dashed box C. Alternatively or in combination a cleaning apparatus may be coupled to or disposed along an upper surface of the front-end environment 583, as depicted by dashed box D. In positions A-C, the cleaning apparatus may or may not be disposed in a chamber. In position D, the cleaning apparatus may be provided with no chamber and may be configured to clean substrates as they move past the cleaning apparatus between pods 584 and the load locks 584. Other locations or configurations of the cleaning apparatus may also be used.

Thus, improved methods and apparatus for cleaning a substrate have been disclosed herein. The inventive apparatus may advantageously allow for the removal of contamination accumulated on a substrate during the manufacturing process, such as during handling the substrate between process steps and while chucking the substrate inside a process chamber, thereby preventing contaminants from reaching the front-side of a substrate and causing yield loss.

While the foregoing is directed to embodiments of the present invention, other and further embodiments of the invention may be devised without departing from the basic scope thereof.

The invention claimed is:

1. A substrate cleaning apparatus, comprising:
    a substrate support having a support surface to support a substrate to be cleaned, wherein the substrate support is rotatable about a central axis normal to the support surface;
    a first nozzle to provide a first cleaning gas to a region corresponding to the position of a radial edge of the substrate away from the central axis when the substrate is supported by the support surface of the substrate support, wherein the first nozzle is positioned to face the edge of the substrate when the substrate is supported by the support surface;
    a first annular body disposed opposite and spaced apart from the support surface of the substrate support by a gap, the first annular body having a central opening defined by an inner wall of the first annular body extending from a first side of the first annular body remote from the support surface to a second side of the first annular body proximate to the support surface, wherein the central opening proximate to the support surface is sized to expose a predominant portion of the support surface, and wherein the inner wall is shaped to provide a reducing size of the gap between the first annular body and the support surface in a radially outward direction; and a first gas inlet to provide a first gas to the central opening of the first annular body.

2. The apparatus of claim 1, further comprising a process chamber having a first volume, wherein the substrate support is disposed within the first volume.

3. The apparatus of claim 1, wherein the substrate support supports the substrate on a second side at a center of the substrate.

4. The apparatus of claim 1, wherein the substrate support supports the substrate on the edge of the substrate.

5. The apparatus of claim 1, wherein the substrate support is configured to rotate the substrate while exposing the edge of the substrate to the first nozzle.

6. The apparatus of claim 1, wherein the first cleaning gas comprises about 10% to about 50% solid carbon dioxide and about 90% to about 50% gaseous carbon dioxide.

7. The apparatus of claim 1, further comprising a second nozzle to provide a second cleaning gas to the region corresponding to the position of the edge of the substrate when the substrate is disposed on the support surface of the substrate support, wherein the second nozzle is positioned to face the edge of the substrate when the substrate is supported by the support surface.

8. The apparatus of claim 7, wherein the second cleaning gas comprises about 1% to about 20% solid carbon dioxide and about 99% to about 80% gaseous carbon dioxide.

9. The apparatus of claim 1, wherein the first nozzle is disposed at an angle of about −175 degrees to about 175 degrees from a plane extending horizontally outward from a center of the substrate when positioned on the support surface.

10. The apparatus of claim 1, wherein the gap is between about 2 mm to about 10 mm.

11. The apparatus of claim 1, wherein the gap extends to a location corresponding to the edge of the substrate when disposed on the support surface.

12. The apparatus of claim 1, further comprising a second annular body disposed opposite and spaced apart from a second side of the substrate by a second gap, the second annular body having a central opening defined by an inner wall of the second annular body extending from a first side of the second annular body remote from the second side of the substrate to a second side of the second annular body proximate to the second side of the substrate, wherein the central opening of the second annular body proximate to the second side of the substrate is sized to expose a predominant portion of the second side of the substrate, and wherein the inner wall of the second annular body is shaped to provide a reducing size of the second gap between the second annular body and the second side of the substrate in a radially outward direction.

13. The apparatus of claim 12, further comprising a second gas inlet to provide a second gas to the central opening of the second annular body.

14. A substrate cleaning apparatus, comprising:

a substrate support having a support surface to support a substrate to be cleaned, wherein the substrate support is rotatable about a central axis normal to the support surface;

a first annular body disposed opposite and spaced apart from the support surface such that the first annular body is spaced apart by a gap from the substrate when supported on the substrate support, the first annular body having a central opening defined by an inner wall of the first annular body extending from a first side of the first annular body remote from the support surface to a second side of the first annular body proximate to the support surface, wherein the inner wall is shaped to provide a radially outward reducing size of the gap between the first annular body and the substrate when supported on the substrate support;

a first gas inlet to provide a first gas to the central opening of the first annular body; and a first nozzle, disposed radially outside of the first annular body, to provide a first cleaning gas to a region corresponding to the position of an edge of the substrate away from the central axis when the substrate is supported by the support surface of the substrate support.

15. The apparatus of claim 14, wherein the gap is between about 2 mm to about 10 mm.

16. The apparatus of claim 14, wherein the gap extends to a location corresponding to an edge of a first side of the substrate when the substrate is supported on the substrate support.

17. The apparatus of claim 14, further comprising:

a second annular body disposed opposite and positioned to be spaced apart from a second side of the substrate, when present, by a second gap, wherein the second annular body has a central opening defined by an inner wall of the second annular body extending from a first side of the second annular body remote from the second side of the substrate to a second side of the second annular body proximate to the second side of the substrate, wherein the central opening of the second annular body proximate to the second side of the substrate is sized to expose a predominant portion of the second side of the substrate, and wherein the inner wall of the second annular body is shaped to provide a reducing size of the second gap between the second annular body and the second side of the substrate in a radially outward direction; and a second gas inlet to provide a second gas to the central opening of the second annular body.

18. A substrate cleaning apparatus, comprising:

a process chamber having an inner volume;

a substrate support disposed in the inner volume and having a support surface to support a substrate to be cleaned, wherein the substrate support is rotatable about a central axis normal to the support surface;

a first annular body having a central opening defined by an inner wall of the first annular body, the inner wall extending from a first side of the first annular body remote from the support surface to a second side of the first annular body proximate to the support surface, wherein the inner wall is shaped proximate to the support surface to provide a gap between the inner wall and the substrate when disposed on the substrate support, wherein the gap reduces in size in a radially outward direction;

a first gas inlet to provide a first gas to the central opening of the first annular body; and a first nozzle, disposed radially outside of the first annular body and positioned to face an edge of the substrate away from the central axis when the substrate is supported by the substrate support.

* * * * *